US009040827B2

(12) United States Patent
Hinoshita

(10) Patent No.: US 9,040,827 B2
(45) Date of Patent: May 26, 2015

(54) LAN CABLE

(71) Applicant: HITACHI CABLE, LTD., Tokyo (JP)

(72) Inventor: Shinji Hinoshita, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 101 days.

(21) Appl. No.: 13/733,776

(22) Filed: Jan. 3, 2013

(65) Prior Publication Data

US 2013/0180754 A1    Jul. 18, 2013

(30) Foreign Application Priority Data

Jan. 13, 2012  (JP) .................................. 2012-005372

(51) Int. Cl.

| H01B 11/00 | (2006.01) |
|---|---|
| H05K 9/00 | (2006.01) |
| H01B 7/00 | (2006.01) |
| H01B 11/02 | (2006.01) |
| H01B 11/06 | (2006.01) |

(52) U.S. Cl.
CPC .............. *H01B 11/002* (2013.01); *H01B 11/06* (2013.01); *H05K 9/0098* (2013.01)

(58) Field of Classification Search
CPC .......... H01B 7/00; H01B 11/002; C08K 3/22; H02G 3/00
USPC ...................................................... 174/113 R
See application file for complete search history.

(56) References Cited

U.S. PATENT DOCUMENTS

| 4,671,896 | A | * | 6/1987 | Hasegawa et al. ............ 523/210 |
|---|---|---|---|---|
| 5,094,781 | A | * | 3/1992 | Miyata et al. ................. 252/609 |
| 5,194,184 | A | * | 3/1993 | Takeyama et al. ............ 252/609 |
| 5,597,981 | A | * | 1/1997 | Hinoshita et al. .......... 174/110 R |
| 7,339,116 | B2 | * | 3/2008 | Gareis et al. ............... 174/113 R |
| 7,772,494 | B2 | * | 8/2010 | Vexler et al. .............. 174/113 R |
| 2003/0070831 | A1 | * | 4/2003 | Hudson ..................... 174/113 R |
| 2003/0205402 | A1 | * | 11/2003 | Koyasu et al. ............. 174/113 C |
| 2003/0217863 | A1 | * | 11/2003 | Clark et al. ............... 174/113 R |
| 2006/0217460 | A1 | * | 9/2006 | Hoshio et al. ................ 523/205 |

FOREIGN PATENT DOCUMENTS

| JP | 10-231390 A | 9/1998 |
|---|---|---|
| JP | 11-250743 A | 9/1999 |
| JP | 2003-323821 A | 11/2003 |
| JP | 2011-198634 A | 10/2011 |

OTHER PUBLICATIONS

Japanese Office Action dated Nov. 25, 2014 with English Translation.

* cited by examiner

*Primary Examiner* — Timothy Thompson
*Assistant Examiner* — Michael F McAllister
(74) *Attorney, Agent, or Firm* — McGinn IP Law Group, PLLC

(57) ABSTRACT

A LAN cable includes an unshielded LAN cable including one or plural pairs of pair twisted wires and a sheath formed collectively covering a periphery of the pair twisted wires. The sheath includes a resin including nickel hydroxide at a mixing mass ratio of not less than 25% and not more than 60%.

19 Claims, 7 Drawing Sheets

LAN CABLE

The present application is based on Japanese patent application No. 2012-005372 filed on Jan. 13, 2012, the entire contents of which are incorporated herein by reference.

BACKGROUND OF THE INVENTION

1. Field of the Invention

This invention relates to a LAN cable.

2. Description of the Related Art

As shown in FIG. 8, conventionally, a LAN cable 81 referred to as a foiled twisted pair cable (FTP) is known that is configured to include a pair or plural pairs of pair twisted wire 82, and a metal shielding member (shield) 83 and a sheath 84 formed on the peripheries of the pair twisted wire 82 in this order (for example, refer to JP-2011-198634 A1). Further, in FIG. 8, in order to simplify the drawing, only a pair of pair twisted wire 82 is shown.

The LAN cable 81 has a small outer diameter (cable outer diameter), and an alien XT in the LAN cable 81 is also low, thus a large number of cables can be installed in a cable tray, consequently, the LAN cable 81 has a merit that an installation space factor is high. However, there is a problem that a common mode noise that is received via a transmission device receiver is heightened due to an induction voltage floating-induced by the metal shielding member 83, thus a multilevel modulated signal and a demodulated signal are buried in the noise, so that necessary transmission capacity cannot be ensured. Further, the alien XT means a crosstalk that is received from the other cables adjacent thereto.

Hereinafter, the reason why the LAN cable 81 can prevent the alien XT and the common mode noise is heightened will be explained in particular.

The pair twisted wire 82 transmits a differential signal, thus reversed-phase electric currents flow in two covered wires (covered bodies) 85 constituting the pair twisted wire 82 (in FIG. 8, the electric currents are shown as a cross mark and a dot mark), consequently, a high frequency electromagnetic field (high frequency alternation electromagnetic field) is generated in the pair twisted wire 82. In case of the LAN cable 81, the high frequency electromagnetic field generated in the pair twisted wire 82 is shielded by the metal shielding member 83, thus approximately total amount of high frequency electric current flows in the surface (eddy current skin thickness part) of the metal shielding member 83 in the side of the pair twisted wire 82. Further, in case of using a member comprised of aluminum such as an aluminum foil as the metal shielding member, the skin thickness in the frequency of 100 MHz is approximately 6 µm. Consequently, the induction electromagnetic field does not reach the pair twisted wire 82 of the LAN cable 81 adjacent thereto, or even if has reached, it is extremely decayed, thus the alien XT is reduced to the extent that it does not exist. In case of the LAN cable 81, the alien XT can be reduced by the metal shielding member 83, thus it is not necessary to enlarge a distance between the pair twisted wires 82 of the LAN cables 81 that are adjacent to each other, so that the outer diameter can be reduced.

On the other hand, as mentioned above, in the LAN cable 81, the high frequency electromagnetic field generated in the pair twisted wire 82 is shielded by the metal shielding member 83, thus approximately total amount of high frequency electric current flows in the metal shielding member 83, consequently, a floating voltage induced by the metal shielding member 83 is heightened. The floating voltage is induced to a receiver as the common mode noise, so as to cause a noise that exceeds discrimination level of the multilevel modulated signal.

As shown in FIG. 9, generally, FTP generates a common mode noise extremely higher than an unshielded twisted pair cables (UTP). Accordingly, in case of the conventional LAN cable 81, a needed frequency band cannot be ensured sufficiently, thus it is difficult to ensure a transmission capacity of 10GBASE-T (10 Gb/s-E transmission using the pair twisted wire) without code error compensation.

Consequently, in order to ensure the transmission capacity of 10GBASE-T without code error compensation, it is preferred to use an unshielded LAN cable referred to as UTP that does not include the metal shielding member 83 that generates the common mode noise.

As the LAN cable referred to as UTP, a LAN cable 101 shown in FIG. 10 and a LAN cable 111 shown in FIG. 11 are generally known, the LAN cable 101 being configured such that a sheath 84 is formed so as to cover the periphery of a pair or plural pairs of a pair twisted wire 82 in a lump (namely, configured such that the metal shielding member 83 is omitted from the LAN cable 81 shown in FIG. 8), and a LAN cable 111 being configured such that projections 112 having a rectangular shape in section are further formed on the inner side of the sheath 84.

SUMMARY OF THE INVENTION

However, in case of the LAN cable 101 shown in FIG. 10, there is a problem that although it can be configured to reduce the profile and the common mode noise, if a plurality of the LAN cables 101 are bundled so as to be wired, the high frequency electromagnetic field generated in the pair twisted wire 82 reaches the pair twisted wires 82 of the LAN cables 101 adjacent thereto, thus the alien XT cannot be reduced to the extent of no problem level, so that alien XT characteristics cannot be satisfied.

In case of the LAN cable 111 shown in FIG. 11, a longitudinal current (Is) that flows through the sheath 84 becomes a state of being decayed in comparison with the LAN cable 101 due to the influence of a low permittivity layer composed of the projections 112 and air surrounding the projections 112, and a distance between the pair twisted wires 82 of the LAN cables 81 that are adjacent to each other is enlarged by forming the projections 112, thus the high frequency electromagnetic field generated in the pair twisted wire 82 is extremely decayed, so that the alien XT can be reduced to the extent of no problem level.

However, in case of the LAN cable 111 shown in FIG. 11, if the projections 112 have a low height, the high frequency electromagnetic field generated in the pair twisted wire 82 reaches the pair twisted wires 82 of the LAN cables 111 adjacent thereto, thus the common mode noise cannot be prevented. Consequently, in case of the LAN cable 111 shown in FIG. 11, there is a problem that in order to prevent the common mode noise, it is necessary to increase the height of the projection 112 (equivalent sheath thickness due to the projection 112), the outer diameter (cable outer diameter) cannot help enlarging. If the outer diameter is enlarged, the number of the cable that can be installed in an installation duct or a cable tray is reduced, so as to deteriorate the installation space factor, thus it is not economic, so that market demand is lowered.

Accordingly, it is an object of the invention to provide a LAN cable that has a small outer diameter while reducing a common mode noise and preventing an alien XT.

(1) According to one embodiment of the invention, a LAN cable comprises:
an unshielded LAN cable comprising one or plural pairs of pair twisted wires and a sheath formed collectively covering a periphery of the pair twisted wires,
wherein the sheath comprises a resin comprising nickel hydroxide at a mixing mass ratio of not less than 25% and not more than 60%.

In the above embodiment (1) of the invention, the following modifications and changes can be made.
(i) The sheath has a relative magnetic permeability of not less than 5 in a used frequency band.
(ii) The sheath has an oxygen index of not less than 21.
(iii) The sheath further comprises one or both of magnesium hydroxide and aluminum hydroxide,
wherein the sheath has an oxygen index of not less than 25.
(iv) The sheath further comprises a projection on an inner periphery thereof so as to form an air layer between the pair twisted wires and the sheath.
(v) The LAN cable further comprises an interposition disposed inside the sheath to secure a separation distance between the plural pairs of pair twisted wires.
(vi) The interposition is cross-shaped in a cross section thereof.

Effects of the Invention

According to one embodiment of the invention, a LAN cable can be provided that has a small outer diameter while reducing a common mode noise and preventing an alien XT.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Hereinafter, the embodiment of the invention will be explained according to the accompanying drawings.

Figure 1A:
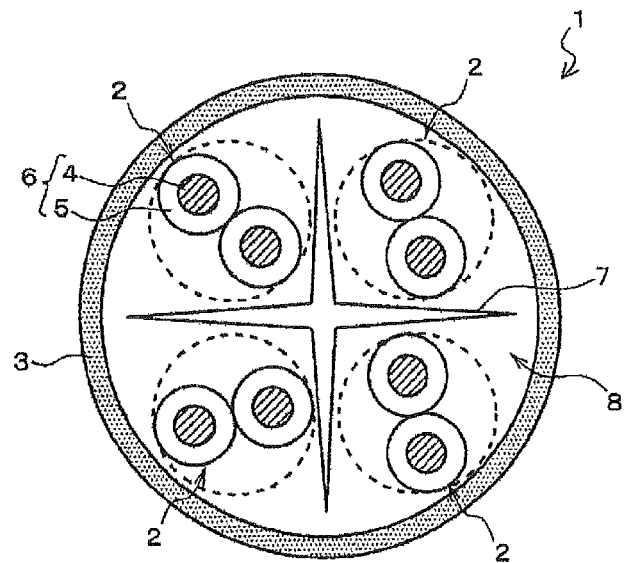
FIG. 1A is a transverse cross-sectional view schematically showing a LAN cable according to one embodiment of the invention.
Figure 1B:
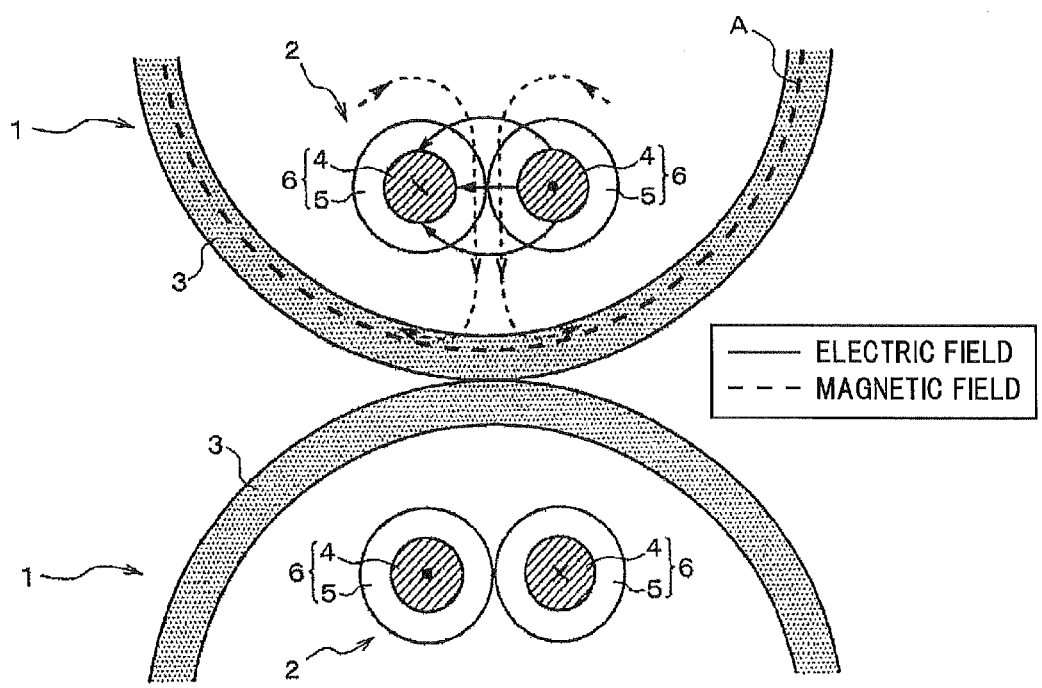
FIG. 1B is a transverse cross-sectional view schematically explaining an operation of the LAN cable.

FIG. 1A is a transverse cross-sectional view schematically showing a LAN cable 1 according to one embodiment of the invention, and FIG. 1B is a transverse cross-sectional view schematically explaining an operation of the LAN cable.

As shown in FIGS. 1A and 1B, the LAN cable 1 is an unshielded LAN cable that is configured to include a pair or plural pairs of pair twisted wire and a sheath 3 formed so as to cover the peripheries of the pair twisted wires 2 in a lump.

The LAN cable 1 according to the embodiment has four pairs of pair twisted wires 2 and is used as a UTP four pairs LAN cable that meets TIA/EIA 568-C-2 Category 6A Standard. Further, FIG. 1B shows a case that two LAN cables 1 are arranged so as to be adjacent to each other, and only one pair of the pair twisted wire 2 is respectively shown in both of the pair twisted wire 2.

The pair twisted wire 2 is formed by twisting two covered wires (covered bodies) 6 that are configured to cover a conductor 4 with an insulating material covering 5. In the embodiment, the pair twisted wire 2 is formed by twisting two covered wires 6 having an outer diameter of 1.2 mm that are formed by extruding the insulating material covering 5 having a thickness of 0.28 mm comprised of low density polyethylene to the conductor 4 having an outer diameter of 0.64 mm comprised of copper.

Further, in case of twisting two covered wires 6, it is preferable that in order to meet transmission loss regulation, the two covered wires 6 are configured such that the twisting pitch becomes short as much as possible, and the twisting pitches in four pairs are respectively differentiated from each other. In addition, it is preferable than the twisting pitch of the respective four pairs is configured to be differentiated from each other at a constant rate as much as possible. In the embodiment, the twisting pitches in four pairs of the pair twisted wires 2 are configured to be 6.3 mm, 7.0 mm, 7.8 mm and 8.7 mm respectively.

In addition, in the embodiment, in order to secure a separation distance between four pairs of the pair twisted wires 2, a cross shape interposition 7 cross-shaped in cross-section is inserted, and each of the pair twisted wires 2 is arranged among the partition wall of the cross shape interposition 7. The cross shape interposition 7 is twisted at the twisting pitch of approximately 100 mm, so as to form an assembled core 8 configured such that four pairs of the pair twisted wires 2 are twisted and assembled. Due to this, if a plurality of the LAN cables 1 are bundled, separation of the pair twisted wires 2 configured such that the twisting pitch is equal to each other is achieved between the LAN cables 1 adjacent to each other, thus the alien XT can be reduced, although it is not sufficient.

Further, in the LAN cable 1 according to the embodiment, as the sheath 3, a sheath comprised of a resin that contains nickel hydroxide in a mixing mass ratio of 25 to 60% is used. Actually, in the embodiment, as the sheath 3, a sheath comprised of a polyolefin resin (a mixture of polyolefin and nickel hydroxide) that contains nickel hydroxide in a mixing mass ratio of 25 to 60% is used. As the polyolefin resin, for example, an ethylene-ethyl acrylate copolymer (EEA) resin can be used.

Figure 2:
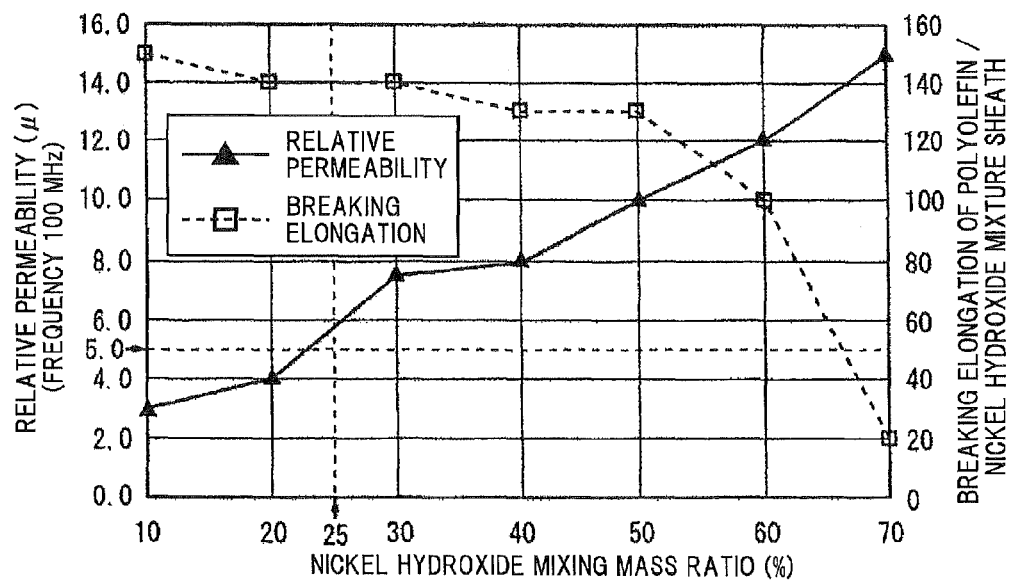
FIG. 2 is a graph showing a relationship of relative magnetic permeability of the sheath and breaking elongation of the sheath to nickel hydroxide mixing mass ratio in the sheath in the embodiment of the invention.

FIG. 2 shows a relationship of relative magnetic permeability (equivalent relative magnetic permeability) of the sheath 3 and breaking elongation of the sheath 3 to nickel hydroxide mixing mass ratio in the sheath 3 in the embodiment of the invention. Further, FIG. 2 shows the relative magnetic permeability in case that frequency is 100 MHz. In addition, the breaking elongation of the sheath 3 is shown as a test result by ASTM D-638 test method, and it is recognized that if the nickel hydroxide mixing mass ratio is not more than 60%, breaking elongation of not less than 100% is maintained, and plasticity of plastic is retained, but if the nickel hydroxide mixing mass ratio is more than 60%, the breaking elongation is drastically reduced, and plasticity of plastic as the sheath cannot be retained.

As shown in FIG. 2, the more the nickel hydroxide mixing mass ratio is increased, the more the relative magnetic permeability of the sheath 3 is increased, to the contrary, the more the nickel hydroxide mixing mass ratio is increased, the more the breaking elongation of the sheath 3 is decreased.

As shown in FIG. 2, the reason why the nickel hydroxide mixing mass ratio in the sheath 3 is configured to be not more than 60% is that it is needed to ensure the breaking elongation of not less than 100% for an acceptable resin elastic performance as a sheath material performance. If the nickel hydroxide mixing mass ratio in the sheath 3 is configured to be more than 60%, the breaking elongation becomes less than 100%, and mechanical characteristics as a LAN cable cannot be sufficiently ensued.

On the other hand, as shown in FIG. 2, the reason why the nickel hydroxide mixing mass ratio in the sheath 3 is configured to be not less than 25% is that it is needed to ensure the relative magnetic permeability of not less than 5 in a used frequency band (100 MHz in FIG. 2). A usual polyolefin sheath has relative magnetic permeability of 1, thus in the conventional LAN cable that uses the usual polyolefin sheath, the high frequency electromagnetic field generated in the pair twisted wire passes through the sheath without being decayed, and the electromagnetic field reaches the pair twisted wire of the LAN cable adjacent to each other, thereby electromagnetic coupling is caused, so that the alien XT is generated.

On the other hand, in the LAN cable 1 according to the embodiment, the nickel hydroxide mixing mass ratio in the sheath 3 is configured to be not less than 25% and the relative magnetic permeability in the used frequency band is configured to be not less than 5, thus electric field strength and magnetic field strength in the sheath 3 become stronger not less than five times in comparison with a usual polyolefin sheath, as a result, the electromagnetic field that passes through the sheath 3 is decayed, so that electromagnetic field that reaches the pair twisted wire 2 of the LAN cable 1 adjacent to each other is reduced.

In other words, in the LAN cable 1 according to the embodiment, the nickel hydroxide mixing mass ratio in the sheath 3 is configured to be not less than 25%, thereby the relative magnetic permeability of the sheath 3 is heightened, and the magnetic field is decayed in the magnetic decay region (A) shown by a thick and broken line in FIG. 1B, so as to allow the LAN cable 1 adjacent to each other not to be affected by induction magnetic field, thereby the generation of the alien XT is prevented. Here, as one example, a case that frequency is 100 MHz has been explained, it is preferable that the sheath 3 has relative magnetic permeability of not less than 5 in the used frequency band.

Figure 3:
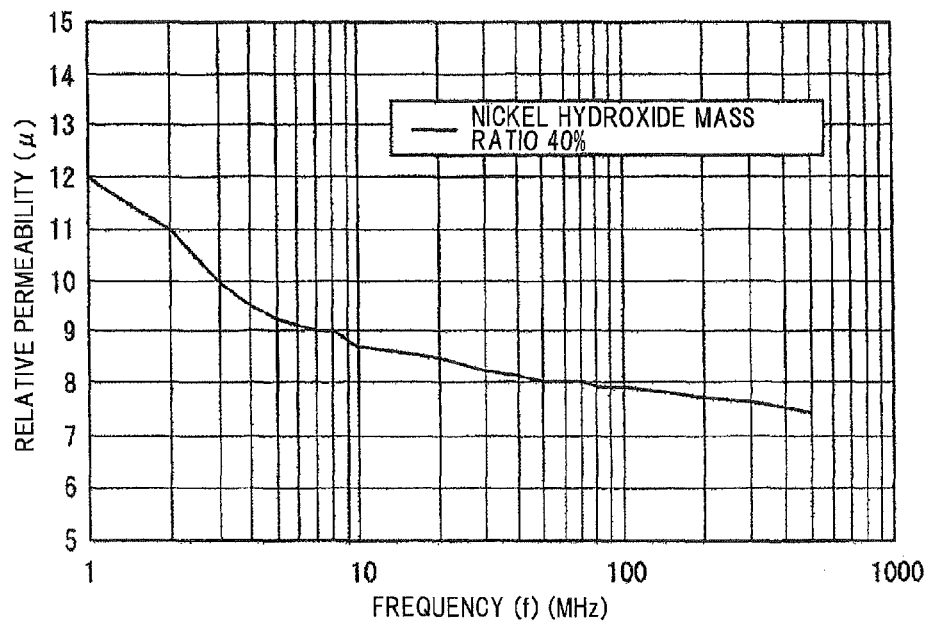
FIG. 3 is a graph showing a frequency characteristic of relative magnetic permeability of the sheath when the nickel hydroxide mixing mass ratio in the sheath is set to 40% in the embodiment of the invention.

In the embodiment, the nickel hydroxide mixing mass ratio in the sheath 3 is set to 40%. FIG. 3 shows a frequency characteristic of relative magnetic permeability of the sheath 3 in the above-mentioned case. As shown in FIG. 3, in case that the nickel hydroxide mixing mass ratio in the sheath 3 is set to 40%, the relative magnetic permeability of the sheath 3 becomes not less than 7, consequently this makes it possible to keep the magnetic field in a state stronger not less than seven times and increase a confinement effect of the magnetic field not less than seven times in comparison with a usual polymer sheath (a polyolefin sheath), thereby the high frequency electromagnetic field generated in the pair twisted wire 2 can be confined in the own sheath 3. Further, as shown in FIG. 2, in case that the nickel hydroxide mixing mass ratio in the sheath 3 is set to 50%, the relative magnetic permeability in the frequency of 100 MHz becomes not less than 10, thereby the high frequency electromagnetic field induced from the pair twisted wire 2 in the sheath 3 can be caught in the density higher not less than ten times when the used frequency band is 100 MHz, consequently it can be decayed.

The thickness of the sheath 3 can be set to a thickness that can sufficiently decay the high frequency electromagnetic field according to the nickel hydroxide mixing mass ratio (the magnetic field decay region (A)). For example, as shown in the embodiment, in case that the relative magnetic permeability of the sheath 3 is set to not less than 7, the thickness of the sheath 3 can be set to not less than 0.5 mm (for example, 0.6 mm). In the embodiment, EEA resin is used as the polyolefin resin that is a base resin, and a sheath material is extruded on the periphery of the assembled core 8, the sheath material being obtained by mixing the EEA resin and nickel hydroxide powders of which mixing mass ratio is 40%, thereby the sheath 3 having a thickness of 0.6 mm is formed, so that the LAN cable 1 having an outer diameter of 7 mm is formed.

In addition, it is preferable that an oxygen index of the sheath 3 is configured to be not less than 21. The reason why the oxygen index of the sheath 3 is configured to be not less than 21 is that if oxygen concentration in air is 21% and the oxygen index is not less than 21, the sheath 3 has a self-extinguishing function, thus it can be used for a flame-retardant cable.

Figure 4:
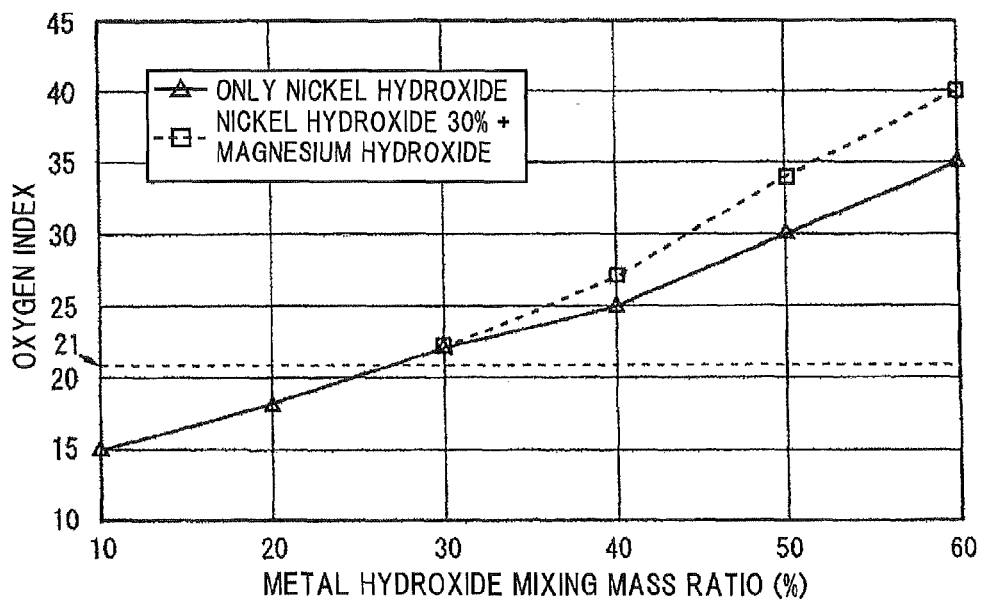
FIG. 4 is a graph showing a relationship of oxygen index to metal hydroxide mixing mass ratio in the sheath in the embodiment of the invention.

As shown in FIG. 4, if the nickel hydroxide mixing mass ratio in the sheath 3 is configured to be not less than 30%, the oxygen index can be configured to be not less than 21.

Generally, in case of allowing a cable to have flame-retardant performance, a sheath material having the oxygen index of not less than 25 is used, thus if the LAN cable 1 is used for a usual flame-retardant cable, the nickel hydroxide mixing mass ratio can be adjusted such that the oxygen index of the sheath 3 becomes not less than 25. At this time, one or both of magnesium hydroxide and aluminum hydroxide is further mixed to the sheath 3 in addition to nickel hydroxide, thereby the sheath 3 can be also configured to have the oxygen index of not less than 25. FIG. 4 shows together a characteristic of the oxygen index of the sheath 3 in case that magnesium hydroxide is further mixed to the sheath 3 in addition to nickel hydroxide.

Next, an alien XT characteristic of the LAN cable 1 will be explained.

Figure 5:
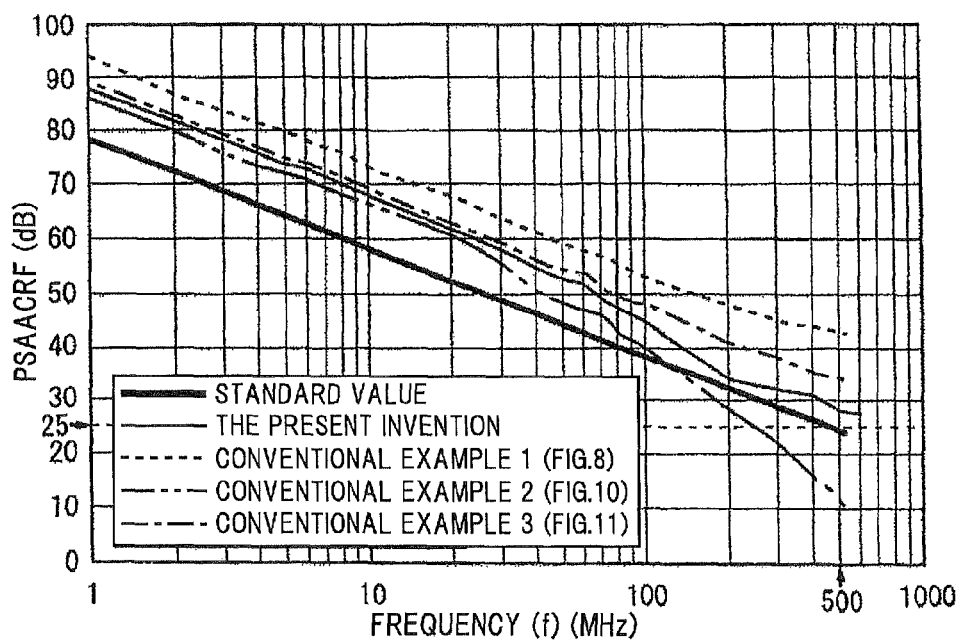
FIG. 5 is a graph showing a frequency characteristic of power sum attenuation to alien cross talk ratio far-end (PSAACRF) in the embodiment of the invention.

FIG. 5 shows a frequency characteristic of power sum attenuation to alien cross talk ratio far-end (PSAACRF) of the LAN cable 1 shown in FIG. 1. Further, FIG. 5 shows together, for comparison, PSAACRF regulation value (regulation value) of TIA/EIA 568-C-2 Category 6A Standard, and PSAACRF characteristic of the conventional LAN cable 81 (FTP, conventional example 1) explained in FIG. 8, the conventional LAN cable 101 (UTP, conventional example 2) explained in FIG. 10, and the conventional LAN cable 111 (UTP in which projections are formed on the inner side of the sheath, conventional example 3) explained in FIG. 11. The conventional LAN cable 81, 101, 111 are configured such that four pairs of the pair twisted wires are separated by a cross shape interposition similarly to the LAN cable 1 of the invention.

Figure 6:
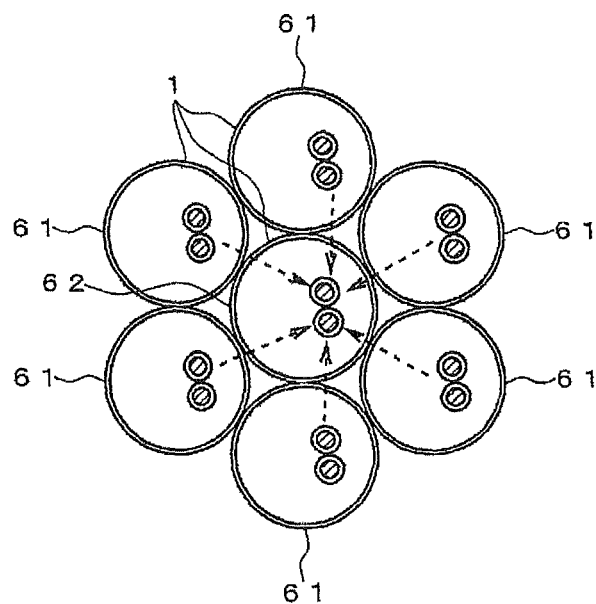
FIG. 6 is an explanatory view showing a measurement method of the PSAACRF in the embodiment of the invention.
Figure 6:
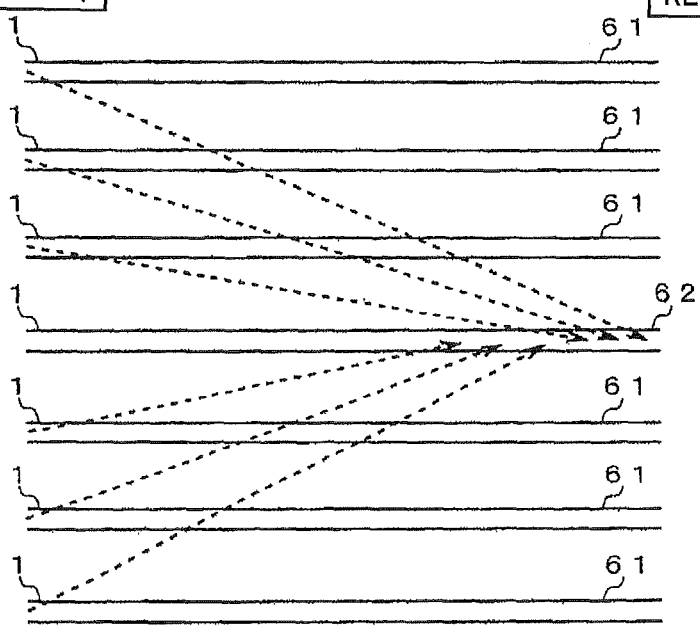

Here, as shown in FIG. 6, if six LAN cables 1 are bundled on the periphery one LAN cable 1 with a central focus on the one LAN cable 1, and the six LAN cables 1 located externally are referred to as induction cables 61 and the one LAN cable 1 located centrally is referred to as an induced cable 62, the PSAACRF means a ratio of the sum of cross talk electric power that cross talks from the six induction cables 61 to a far-end (a signal receiving end) of a pair of the pair twisted wire 2 in the induced cable 62, and signal receiving electric power (transmitting electric power—transmission loss of the pair twisted wire 2). The cross talk channel is approximately an in-phase channel, thus the PSAACRF becomes the worst value in cross talks of various channels such as a near-end cross talk (PSACRN: ASTM D 4566-08, chapter 26, formula (20)). Due to this, the PSAACRF characteristic is used as a typical characteristic for evaluating the alien XT characteristic. Further, measurement of the PSAACRF is based on ASTM D 4566-08, chapter 28, formula (29).

As shown in FIG. 5, the LAN cable 1 (the invention) is configured such that the nickel hydroxide mixing mass ratio in the sheath 3 is set to 40%, consequently the relative magnetic permeability becomes not less than 7, so that a confinement effect of the magnetic field is increased not less than seven times in comparison with a usual polymer sheath, thereby the high frequency electromagnetic field generated in the pair twisted wire 2 can be confined in the own sheath 3, thus induction is not easily generated in the other LAN cables 1 so that PSAACRF deterioration in high frequency can be prevented.

In particular, the LAN cable 1 can satisfy the PSAACRF regulation value of TIA/EIA 568-C-2 Category 6A Standard in the frequency band of 1 to 500 MHz.

Figure 8:
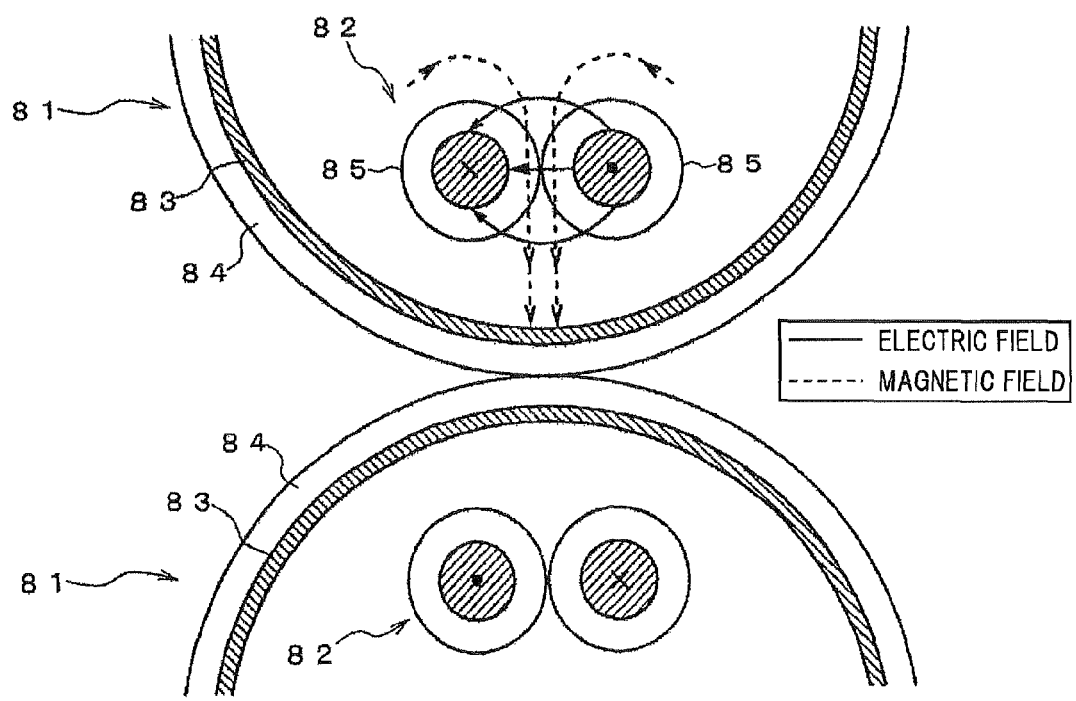
FIG. 8 is a transverse cross-sectional view schematically showing a conventional LAN cable (FTP)
Figure 9:
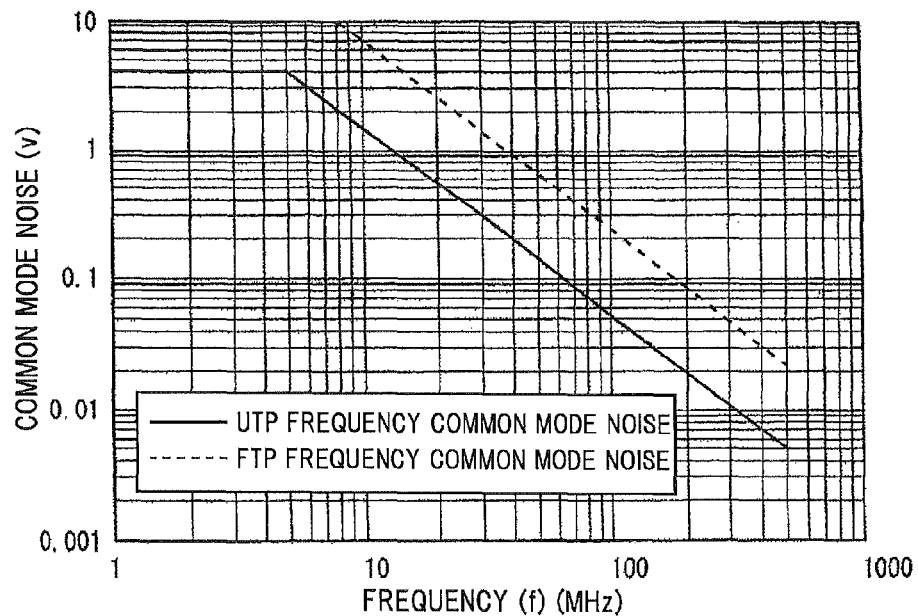
FIG. 9 is a graph showing a frequency characteristic of common mode noise of UTP and FTP.

On the other hand, in the LAN cable 81 of the conventional example 1 shown in FIG. 8, since the high frequency electromagnetic field generated in the pair twisted wires 82 can be blocked by the metal shielding member 83 such as an aluminum foil, the LAN cable 81 meets the PSAACRF regulation value. However, as mentioned above, the LAN cable 81 of the conventional example 1 has a problem that the common mode noise that is received via a transmission device receiver is high.

Figure 10:
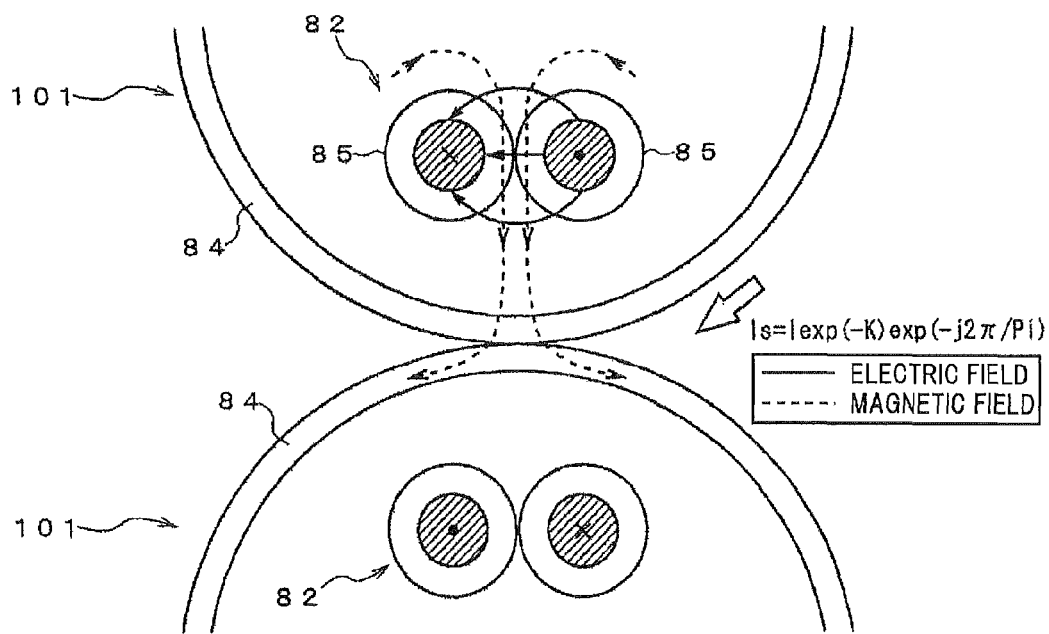
FIG. 10 is a transverse cross-sectional view schematically showing a conventional LAN cable (UTP)

In addition, in the LAN cable 101 of the conventional example 2 shown in FIG. 10, since the relative magnetic permeability of the sheath 84 is 1, and a separation distance between the pair twisted wire 82 located in an inducing side and the pair twisted wire 82 located in an induced side is small, the LAN cable 101 cannot meet the PSAACRF regulation value.

Figure 11:
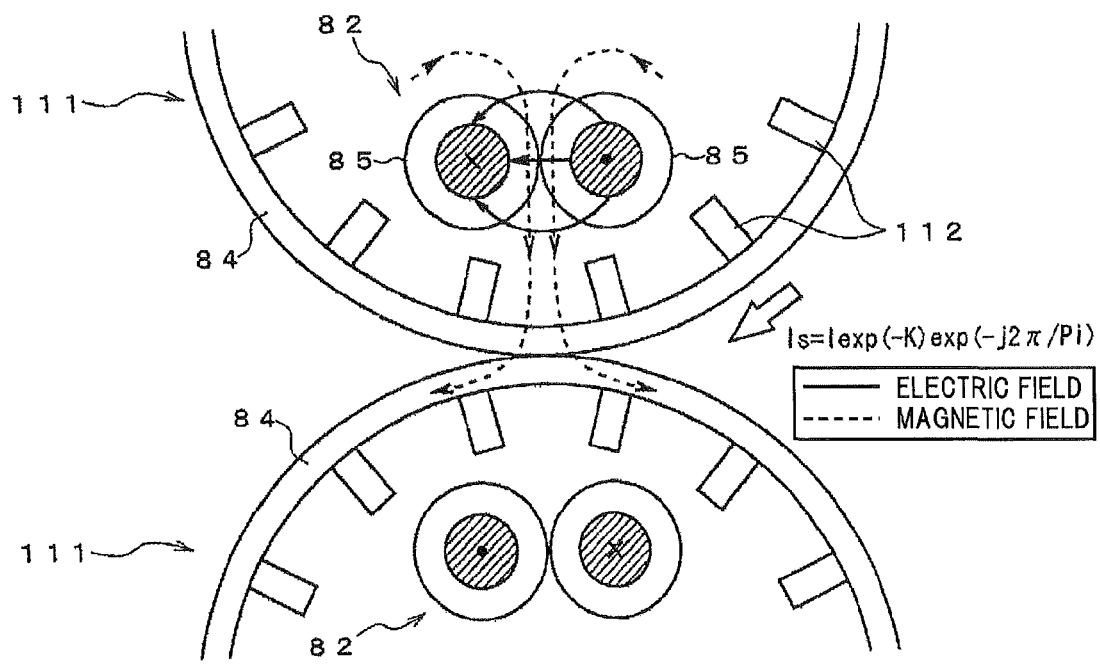
FIG. 11 is a transverse cross-sectional view schematically showing a conventional LAN cable (UTP configured such that projections are formed on the inner side of the sheath).

Furthermore, in the LAN cable 111 of the conventional example 3 shown in FIG. 11, since the equivalent permeability of air layer formed in the projections 112 is small, and a separation distance between the pair twisted wire 82 located in an inducing side and the pair twisted wire 82 located in an induced side is large, the LAN cable 111 can meet the PSAACRF regulation value. However, as mentioned above, the LAN cable 111 of the conventional example 3 has a problem that the outer diameter is large and the installation space factor is low.

Table 1 collectively shows the above-mentioned evaluation results. Further, in Table 1, an evaluation of the outer diameter (an outer diameter evaluation) was carried out such that a case that the outer diameter is not more than 7.3 mm is ◯ (acceptable), and a case that the outer diameter is more than 7.3 mm is×unacceptable). The 7.3 mm criteria of the outer diameter is derived from an actual market demand that the conventional product has been originally a high performing product like 10 Gb/s-E transmission, thus it is acceptable to exceed 6.3 mm that is the outer diameter of the conventional product, but it is unacceptable to exceed the outer diameter of FTP cable that uses the shielding member in terms of the installation space factor. In addition, an evaluation of the alien XT (an alien XT evaluation) was carried out such that a case that the PSAACRF in frequency of 500 MHz is not less than the regulation value (PSAACRF regulation value of TIA/EIA 568-C-2 Category 6A Standard) is ◯ (acceptable), and a case that the alien XT is less than the regulation value is×(unacceptable). An evaluation of the common mode noise (common mode noise evaluation) was carried out such that a case that the metal shielding member is not included is ◯ (acceptable), and a case that the metal shielding member is included is×(unacceptable). A comprehensive evaluation was carried out such that a case that all of the evaluations of the outer diameter, the alien XT and the common mode noise are acceptable is ◉ (acceptable), and a case except for the above-mentioned case is×(unacceptable).

TABLE 1

| | Outer diameter (mm) | PSAACRF @500 MHz (dB) | Diameter evaluation | Alien XT evaluation | Common mode noise evaluation | Comprehensive evaluation |
|---|---|---|---|---|---|---|
| Present invention | 7.0 | 28 | ◯ | ◯ | ◯ | ◉ |
| Conventional Example 1 (FIG. 8) | 7.3 | 43 | ◯ | ◯ | X | X |
| Conventional Example 2 (FIG. 10) | 6.0 | 12 | ◯ | X | ◯ | X |
| Conventional Example 3 (FIG. 11) | 8.6 | 34 | X | ◯ | ◯ | X |

As shown in Table 1, the LAN cable 1 according to the invention was evaluated as acceptable in terms of all of the evaluations of the outer diameter, the alien XT and the common mode noise. Only the LAN cable 1 according to the invention was evaluated as acceptable in terms of the comprehensive evaluation.

As mentioned above, the LAN cable 1 according to the embodiment uses the sheath 3 that is comprised of a resin that contains nickel hydroxide in a mixing mass ratio of 25 to 60%.

The nickel hydroxide mixing mass ratio in the sheath 3 is configured to be not less than 25%, thereby the relative magnetic permeability of the sheath 3 becomes not less than 5, so that the high frequency electromagnetic field generated in the pair twisted wire 2 can be confined in the own sheath 3, namely the magnetic field is decayed in the magnetic decay region (A) so as to allow the LAN cable 1 adjacent to each other not to be affected by induction magnetic field, thereby the generation of the alien XT is prevented. Furthermore, in the LAN cable 1, the high frequency electromagnetic field can be sufficiently decayed, so that the outer diameter can be reduced.

In addition, the nickel hydroxide mixing mass ratio in the sheath 3 is configured to be not more than 60%, thereby the breaking elongation of the sheath 3 becomes not less than 100%, so that mechanical characteristics as a LAN cable can be sufficiently ensured.

Further, the LAN cable 1 adopts an unshielded sheath that does not use the metal shielding member, thus the common mode noise that is received via a transmission device receiver can be reduced.

Namely, according to the invention, the LAN cable 1 having advantages that the common mode noise is low, the outer diameter is small and the alien XT can be prevented can be realized. In particular, the LAN cable 1 can improve a ratio (S/XT-N) of signal (S) to XT-noise (XT-N) in the frequency band of not less than 250 MHz, can enlarge transmission capacity of the multilevel modulated signal processing, and can be preferably used as a pair twisted wire cable for 10GBASE-T.

Furthermore, the nickel hydroxide mixing mass ratio in the sheath 3 is adjusted such that the oxygen index of the sheath 3 becomes not less than 21, whereby the sheath 3 can have flame-retardant property.

The LAN cable 1 can be used as a LAN cable for 10GBASE-T system distribution. At this time, the LAN cable 1 can be used as, of course, a horizontal distributing cable, and by having flame-retardant property, it can be also used as a vertical distributing cable. The LAN cable 1 can prevent the alien XT, thus a plurality of the LAN cables 1 are bundled, thereby the LAN cable 1 can be horizontally installed in the same cable rack and can be vertically installed in the same cable ladder. Namely, according to the invention, the LAN cable 1 having advantages that the installation space factor is high and transmission capacity of 10GBASE-T transmission is non-problematic can be realized.

Next, the other embodiment of the invention will be explained.

Figure 7:
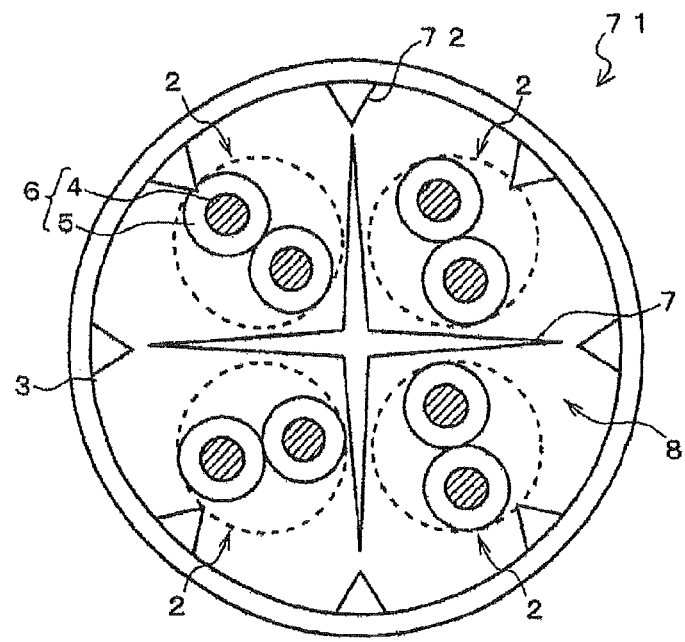
FIG. 7 is a transverse cross-sectional view schematically showing a LAN cable according to another embodiment of the invention.

The LAN cable 71 shown in FIG. 7 has basically the same configuration as the LAN cable 1 shown in FIG. 1, and the LAN cable 71 is configured such that a plurality of projections 72 having a triangular shape in section are further formed on the inner periphery of the sheath 3, thereby air layer (equivalent air layer) having permittivity of approximately 1 is formed in the inner side of the sheath 3, and the high frequency electromagnetic field generated in the pair twisted wires 2 is blocked by two layers of the air layer and the sheath 3, so as to prevent the alien XT.

In the LAN cable 71, the projections 72 are formed so as to form the air layer, thereby the outer diameter is slightly enlarged, but a separation distance between the pair twisted wires 2 of the LAN cable 71 adjacent to each other can be enlarged, thus a shielding effect of the high frequency electromagnetic field due to the separation distance and the air layer makes it possible to further improve the alien XT characteristic.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A LAN cable, comprising: an unshielded LAN cable comprising one or plural pairs of pair twisted wires and a sheath formed collectively covering a periphery of the pair twisted wires, wherein the sheath comprises a resin comprising nickel hydroxide at a mixing mass ratio of not less than 25% and not more than 60%, wherein the nickel hydroxide is compounded into the sheath to prevent an alien crosstalk.

2. The LAN cable according to claim 1, wherein the sheath has a relative magnetic permeability of not less than 5 in a used frequency band.

3. The LAN cable according to claim 1, wherein the sheath has an oxygen index of not less than 21.

4. The LAN cable according to claim 1, wherein the sheath further comprises at least one of magnesium hydroxide and aluminum hydroxide, and
wherein the sheath has an oxygen index of not less than 25.

5. The LAN cable according to claim 1, wherein the sheath includes a projection on an inner periphery thereof so as to form an air layer between the pair twisted wires and the sheath.

6. The LAN cable according to claim 1, further comprising an interposition disposed inside the sheath to secure a separation distance between the plural pairs of pair twisted wires.

7. The LAN cable according to claim 6, wherein the interposition is cross-shaped in a cross section thereof.

8. An unshielded LAN cable, comprising: one or more pairs of twisted pair wires; and a polymer sheath provided so as to cover a circumference of the one or more pairs of twisted pair wires together, wherein the polymer sheath containing nickel hydroxide has a relative permeability in a 1 to 900 MHz frequency band of at least 5 or higher, wherein nickel hydroxide is compounded into the sheath to prevent an alien crosstalk.

9. The unshielded LAN cable according to claim 8, wherein the polymer sheath comprises a resin comprising nickel hydroxide at a mixing mass ratio of not less than 25% and not more than 60%.

10. The unshielded LAN cable according to claim 9, wherein the polymer sheath further comprises aluminum hydroxide.

11. The unshielded LAN cable according to claim 10, wherein the aluminum hydroxide is compounded into the polymer sheath to prevent an alien crosstalk.

12. The unshielded LAN cable according to claim 8, wherein the polymer sheath comprises a polyolefin resin.

13. The unshielded LAN cable according to claim 12, wherein the polyolefin resin comprises a mixture of polyolefin and nickel hydroxide.

14. The unshielded LAN cable according to claim 13, wherein a mixing mass ratio of the nickel hydroxide in the polyolefin resin is in a range from 25% to 60%.

15. The unshielded LAN cable according to claim 12, wherein the polyolefin resin comprises an ethylene-ethyl acrylate copolymer (EEA) resin.

16. The unshielded LAN cable according to claim 8, wherein the polymer sheath has an oxygen index of at least 21.

17. The LAN cable according to claim 1, wherein the sheath comprises a polymer sheet with a relative permeability in a 1-to-500 MHz frequency band of at least 5.

18. The LAN cable according to claim 1, wherein the sheath further comprises aluminum hydroxide.

19. The LAN cable according to claim 1, wherein the resin comprises a polyolefin resin comprising an ethylene-ethyl acrylate copolymer (EEA) resin.

* * * * *